United States Patent [19]

Sheu et al.

[11] Patent Number: 5,614,420

[45] Date of Patent: Mar. 25, 1997

[54] METHOD OF PREVENTING MASK TONE ERROR

[75] Inventors: Jhy S. Sheu; Yi-Shu Chen; Ren-Yih Zeng, all of Hsin-chu, Taiwan

[73] Assignee: Taiwan Semiconductor Manufacturing Company Ltd., Hsinchu, Taiwan

[21] Appl. No.: 649,978

[22] Filed: May 16, 1996

[51] Int. Cl.⁶ .................................................. H01L 21/66
[52] U.S. Cl. ............................. 437/8; 437/34; 437/924; 148/DIG. 137; 430/5
[58] Field of Search ......................... 430/5, 22; 356/389; 437/8, 924, 34; 148/DIG. 137

[56] References Cited

U.S. PATENT DOCUMENTS

| | | | |
|---|---|---|---|
| 4,247,203 | 1/1981 | Levy et al. ............................. | 356/398 |
| 4,532,650 | 7/1985 | Wihl et al. ............................. | 382/144 |
| 5,436,097 | 7/1995 | Norishima et al. ..................... | 430/5 |

*Primary Examiner*—Trung Dang
*Attorney, Agent, or Firm*—George O. Saile; Larry J. Prescott

[57] ABSTRACT

A method is described for checking masks used for the ion implantation steps in the manufacture of semiconductor integrated circuit element wafers before these masks are used for wafer processing. The masks being checked are segmented and the tone, clear or dark, is described by a numerical or logical value assigned to each segment. Mathematical operations on the data representing each mask are carried out and the results are compared with values expected from masks which are error free. Results From the mathematical operations on data representing masks which do not agree with the expected results indicate a high probability of error in those masks. The masks are then checked carefully and errors corrected before using the masks in wafer processing.

18 Claims, 3 Drawing Sheets

METHOD OF PREVENTING MASK TONE ERROR

BACKGROUND OF THE INVENTION

(1) Field of the Invention

The invention relates to a method of checking mask patterns to prevent mask tone errors from causing wafer defects and more particularly to using digital mask data to prevent mask tone errors.

(2) Description of the Related Art

This invention uses digital data describing the clear and dark areas of the masks used in semiconductor wafer manufacturing to check for mask errors before the masks are used in wafer processing. The digital data of different masks is combined in a predetermined manner and the results are checked against expected values. Unexpected results indicate a high probability of mask error.

In U.S. Pat. No. 5,436,097 to Norishima et al. describes a method of mask checking that uses resistance measurements of a conductive film deposited in a test pattern. The test pattern is formed using different rotational orientations and the resistance measurements for the different orientations are compared. This method checks the aligning equipment and the optical system used and is quite different from the method described in this invention.

SUMMARY OF THE INVENTION

The manufacture of integrated circuit elements require a large number of process steps using masks. For integrated circuit elements having devices such as complimentary metal oxide semiconductor field effect transistors, CMOS devices, or the like these process steps often include ion implantation for $N^-$ wells, $P^-$ wells, $N^+$ source/drain regions, $P^+$ source/drain regions and the like. Mask errors, such as in masks used for ion implantation, can form defects in semiconductor wafers which will not be detected until substantial process time and capability have been expended on the defective wafers. Identification of mask errors before the defective masks have been used to process wafers will result in considerable savings in process time., process capability, and cost.

It is a principal objective of this invention to provide a method for checking masks for defects prior to using the masks for wafer processing.

This objective is achieved by performing logical comparisons of the tone, clear or dark, of the various masks used for the ion implantation steps of the wafer processing. The digital data required for these comparisons are available from the mask design data. The logical comparisons are compared with expected results. If the logical comparisons produce the expected results there is a high probability that the masks are correct and the wafer processing is continued. If the logical comparisons do not produce the expected results there is a high probability that the masks are defective and the masks are subjected to a thorough technical analysis before being used to process wafers. Errors discovered by the technical evaluation are corrected and the logical comparisons are performed again. If the logical comparisons now produce expected results the wafer processing is continued. If the logical comparisons again fail to produce expected results the thorough technical analysis, mask error correction, and logical comparison is repeated until the expected results are achieved.

DESCRIPTION OF THE PREFERRED EMBODIMENTS

Figure 1:
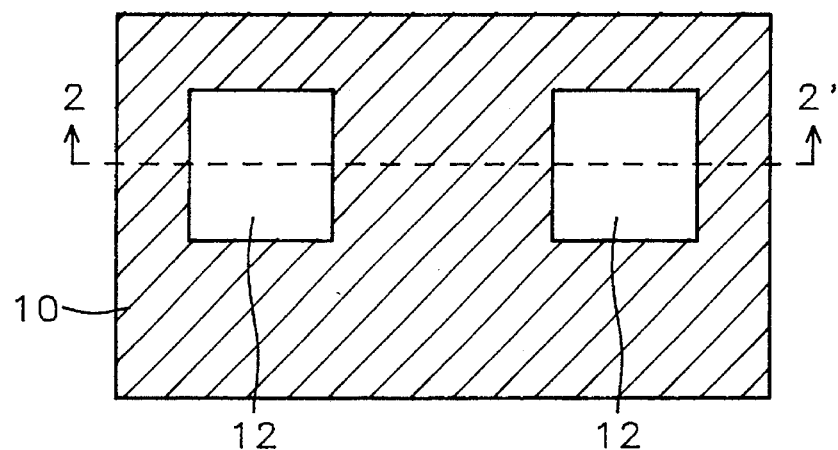
FIG. 1 shows a top view of a mask used for ion implantation.
Figure 2:
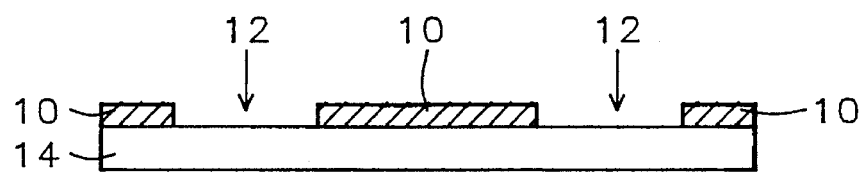
FIG. 2 shows a cross section view of a mask used for ion implantation.

Refer now to FIGS. 1–7, there is shown an embodiment of the mask checking method of this invention. FIG. 1 shows a top view of a typical mask used for ion implantation steps in integrated circuit element fabrication. The mask has transparent regions 12 and opaque regions 10. The opaque regions are indicated by diagonal shading in FIG. 1. The mask regions are described according to the mask tone wherein the tone of the transparent regions is clear and the tone of the opaque regions is dark. FIG. 2 shows a cross section of the mask shown in FIG. 1 along the section line 2-2' showing the regions of clear tone 12 and dark tone 10. The mask is formed on a transparent substrate 14. This discussion of the mask will use the tone descriptions clear and dark to describe and analyze the mask. Polarity is also used to describe the masks wherein polarity is the inverse of tone.

Figure 3:
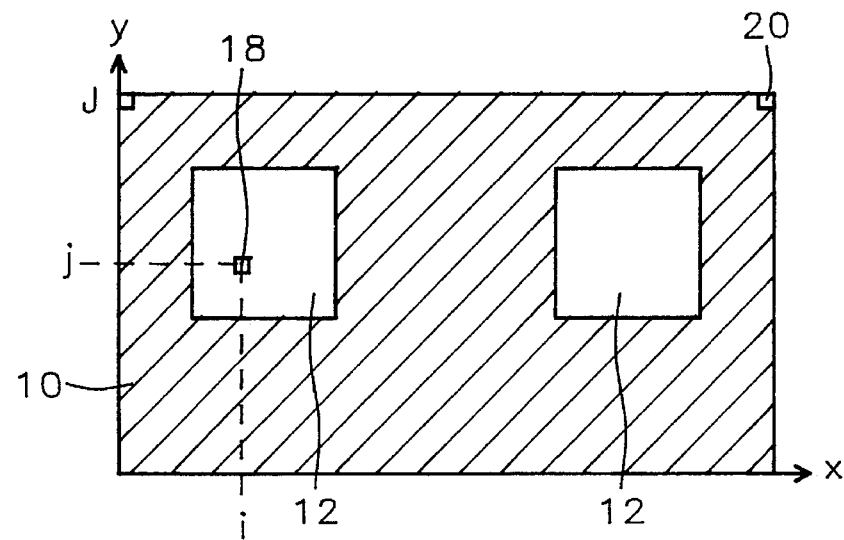
FIG. 3 shows a top view of a mask used for ion implantation showing division of the mask into segments.

FIG. 3 shows the top view of a mask laid out on X-Y co-ordinates. The mask has transparent regions 12 and opaque regions 10. The opaque regions 10 are indicated by diagonal shading in FIG. 3. In the X direction the mask is divided into I divisions where I is a positive integer. In the Y direction the mask is divided into J divisions, where J is a positive integer. The mask then has M segments, where $M=I\times J$, and each segment is either clear or dark. The mask shown in FIG. 3 has clear regions 12 and dark regions 10 so that the segment at the ij co-ordinate 18 is clear and the segment at the IJ coordinate 20 is dark. In this example I is 6780 and J is 6600 so that the mask is divided into 44,648,000 segments. A logical one is assigned to clear segments 18 and a logical zero is assigned to dark segments 20. In this manner the mask is described digitally. If greater resolution is required the number of segments can be increased. If the segments are numbered from 1 to M the segment having a particular number in one mask will have the same relative position as the segment having the same number in another mask. This digital data is already available from the mask design data.

Figure 4:
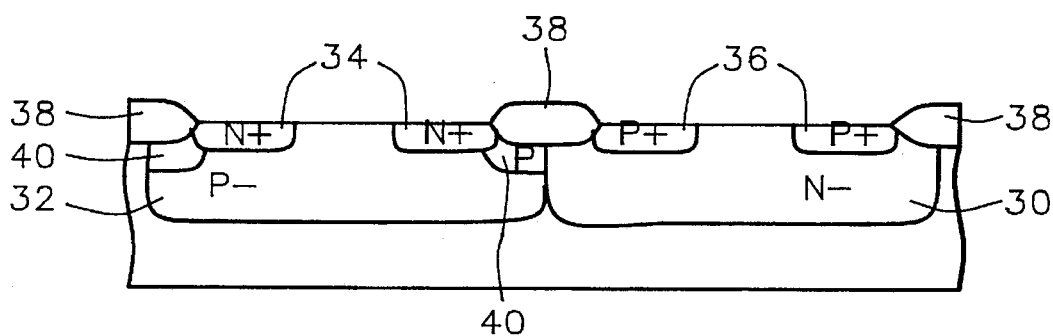
FIG. 4 shows a cross section view of a CMOS device using both a $P^-$ well and an $N^-$ well.

Refer now to FIG. 4, there is shown a cross section of two complimentary metal oxide semiconductor devices using a $P^-$ well 32, an $N^-$ well 30, and a P channel stop or field region 40 located under a part of the field oxide isolation region 38. $N^+$ source/drain regions 34 are formed in the $P^-$ well 32 and $P^+$ source/drain regions 36 are formed in the $N^-$ well 30. The $P^-$ well 32, $N^-$ well 30, P field region 40, $N^+$ source/drain regions 34, and $P^+$ source/drain regions 36 are formed using masks and ion implantation. As can be seen from FIG. 4 there should be very little overlap of the clear regions or the dark regions of the P⁺ source/drain mask and of the N⁺ source/drain mask, of the N⁻ well mask and the P field mask, of the N⁻ well mask and the P⁻ well mask, or of the N⁺ source/drain mask and the N⁻ well mask. Also as seen in FIG. 4, there should be a large overlap of the clear regions and the dark regions of the P⁺ source/drain mask and the N⁻ well mask.

A set of M index numbers $A_1, A_2, A_3, \ldots, A_M$ are defined, one index number for each of the M segments of the P⁻ well mask where the index number corresponding to a clear region has a value of 1 and the index number corresponding to a dark region has a value of 0. A similar set of M index numbers $B_1, B_2, B_3, \ldots, B_M$ are defined, one index number for each of the M segments of the N⁻ well mask. Index numbers $C_1, C_2, C_3, \ldots, C_M$ are defined for each of the M segments of the P field mask; index numbers $D_1, D_2, D_3, \ldots, D_M$ are defined for each of the M segments of the P⁺ source/drain mask; and index numbers $E_1, E_2, E_3, \ldots, E_M$ are defined for each of the M segments of the N⁺ source/drain mask. In each case the index number for a dark region is 0 and the index number for a clear region is 1.

Next a first index ratio, $R_1$, second index ratio, $R_2$, third index ratio, $R_3$, fourth index ratio, $R_4$, and fifth index ratio $R_5$ are defined according to the following equations:

$$R_1=(D_1 \times E_1+D_2 \times E_2+D_3 \times E_3+ \ldots +D_M \times E_M)/M,$$

$$R_2=(B_1 \times C_1+B_2 \times C_2+B_3 \times C_3+ \ldots +B_M \times C_M)/M,$$

$$R_3=(B_1 \times A_1+B_2 \times A_2+B_3 \times A_3+ \ldots +B_M \times A_M)/M,$$

$$R_4=(E_1 \times B_1+E_2 \times B_2+E_3 \times B_3+ \ldots +E_M \times B_M)/M, \text{ and}$$

$$R_5=(D_1-B_1+D_2-B_2+D_3-B_3+ \ldots +D_M-B_M)/M.$$

In accordance with the clear and dark region overlap expected described above it is then expected that $R_1, R_2, R_3, R_4,$ and $R_5$ will be small compared to 1. If $R_1, R_2, R_3, R_4,$ and $R_5$ meet this expectation there is a good probability that the masks are correct. If $R_1, R_2, R_3, R_4,$ and $R_5$ are different than expected there is an almost certainty that there is a mask error and the masks must be thoroughly analyzed before processing any semiconductor wafers. For this embodiment $R_1, R_2,$ and $R_3$ must be less than 0.05; and $R_4$ and $R_5$ must be less than 0.10.

Figure 7:
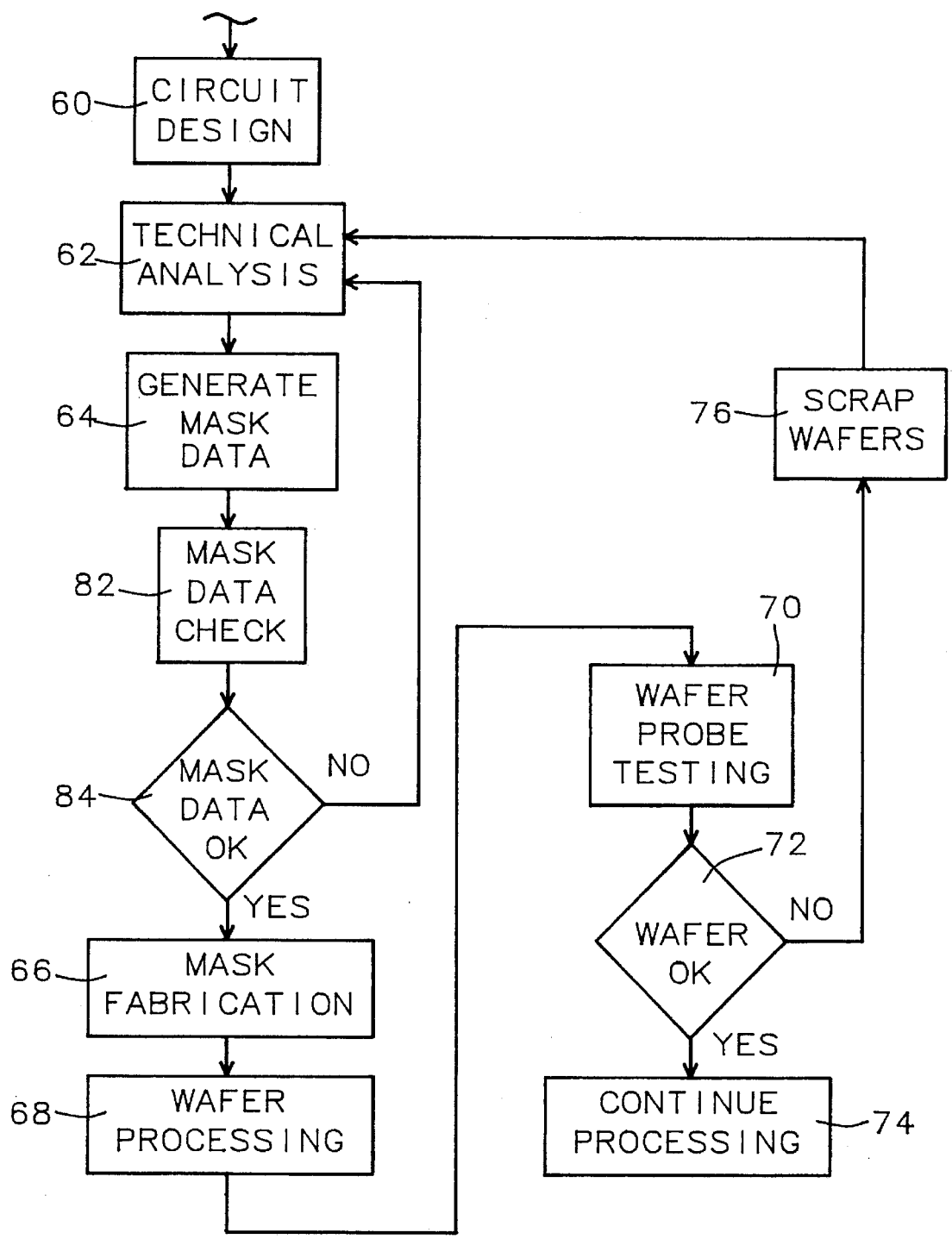
FIG. 7 shows a flow diagram of the mask checking method of this invention.

Refer now to FIG. 7, there is shown the flow diagram of the method of checking mask quality of this invention. A circuit design 60 and a technical analysis 62 results is mask design data 64 which provides the index numbers described above. A mask data check 82 comprises forming the first, second, third, fourth, and fifth index ratios, $R_1, R_2, R_3, R_4,$ and $R_5$; which are compared with the expected values of the index numbers of less than 0.05 for $R_1, R_2,$ and $R_3$; and less than 0.10 for $R_4$ and $R_5$. If the index numbers are not within the expected range the technical analysis 62 is repeated and the masks are corrected. If the index numbers are as expected the mask fabrication 66 is completed and the masks are used in wafer processing 68.

At the step of wafer probe testing 70 if the evaluation of the wafers 72 indicates the wafers are good the wafer processing continues 74. If the wafers do not test good the wafers are scrapped 76 and the technical analysis 62 is repeated. This process flow allows mask errors to be discovered and corrected early in the process before processing of actual wafers.

Figure 5:
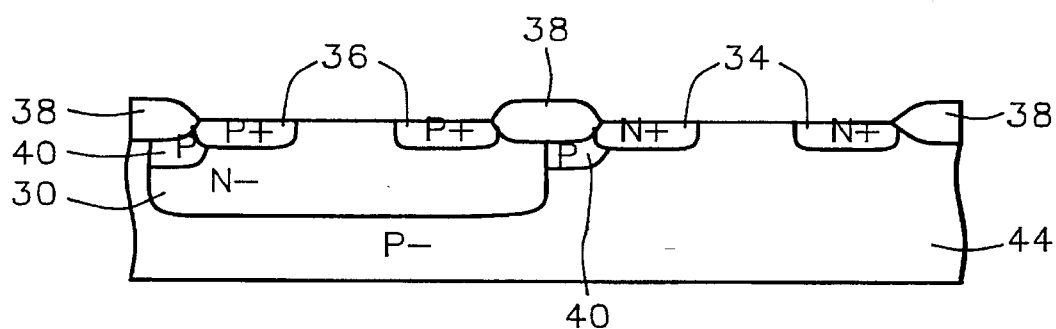
FIG. 5 shows a cross section view of a CMOS device using an $N^-$ well.

Refer now to FIG. 5, there is shown a cross section of a slightly different CMOS device structure. This structure formed on a P⁻ substrate 44 has an N⁻ well 30, and a P channel stop or field region 40 located under a part of the field oxide isolation region 38. N⁺ source/drain regions 34 are formed in the P⁻ substrate 44 and P⁺ source/drain regions 36 are formed in the N⁻ well 30.

As in the preceding embodiment index numbers $B_1, B_2, B_3, \ldots, B_M$ are defined for the M segments of the N⁻ well mask; index numbers $C_1, C_2, C_3, \ldots, C_M$ are defined for the M segments of the P field mask; index numbers $D_1, D_2, D_3, \ldots, D_M$ are defined for the M segments of the P⁺ source/drain mask; and index numbers $E_3, E_2, E_3, \ldots, E_M$ are defined for the M segments of the N⁺ source/drain mask. In each case the index number for a dark region is 0 and the index number for a clear region is 1.

As in the preceding embodiment a first index ratio, $R_4$, a second index ratio, $R_2$, a third index ratio, $R_3$, and a fourth index ratio, $R_4$ are defined according to the following equations:

$$R_1=(D_1 \times E_1+D_2 \times E_1+D_3 \times E_3+ \ldots +D_M \times E_M)M,$$

$$R_2=(B_1 \times C_1+B_2 \times C_2+B_3 \times C_3+ \ldots +B_M \times C_M)M,$$

$$R_3=(E_1 \times B_1+E_2 \times B_3+E_3 \times B_3+ \ldots +E_M \times B_M)/M, \text{ and}$$

$$R_4=(D_1-B_1+D_2-B_2+D_3-B_3+ \ldots +D_M-B_M)/M.$$

In this embodiment it is expected that $R_1, R_2, R_3,$ and $R_4$ will be small compared to 1. For this embodiment $R_1$ and $R_2$ must be less than 0.05, and $R_3$ and $R_4$ must be less than 0.10. The mask quality is then evaluated as described in the preceding embodiment and as shown in the flow diagram of FIG. 7.

Figure 6:
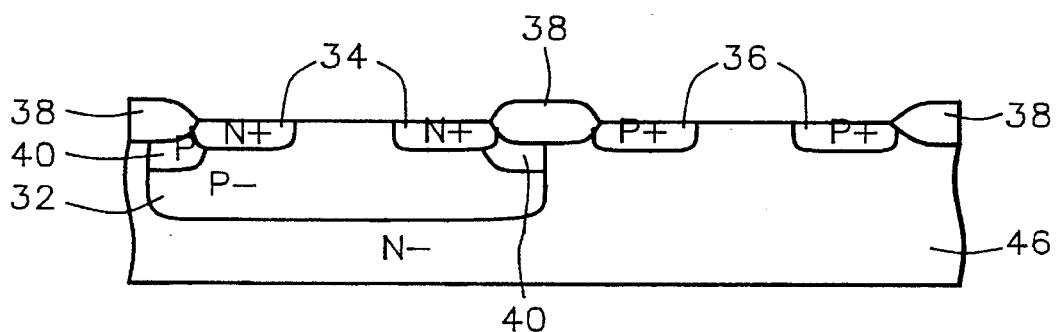
FIG. 6 shows a cross section view of a CMOS device using a $P^-$ well.

Refer now to FIG. 6, there is shown a cross section of a slightly different CMOS device structure. This structure formed on an N⁻ substrate 46 has a P⁻ well 32, and a P channel stop or field region 40 located under a part of the field oxide isolation region 38. N⁺ source/drain regions 34 are formed in the P⁻ well 32 and P⁺ source/drain regions 36 are formed in the N⁻ substrate 46.

As in the preceding embodiment index numbers $A_1, A_2, A_3, \ldots, A_M$ are defined for the M segments of the P⁻ well mask; index numbers $D_1, D_2, D_3, \ldots, D_M$ are defined for the M segments of the P⁺ source/drain mask; and index numbers $E_1, E_2, E_3, \ldots, E_M$ are defined for the M segments of the N⁺ source/drain mask. In each case the index number for a dark region is 0 and the index number for a clear region is 1.

As in the preceding embodiment a first index ratio, $R_1$, a second index ratio, $R_2$, and a third index ratio, $R_3$, are defined according to the following equations:

$$R_1=(D_1 \times E_1+D_2 \times E_2+D_3 \times E_3+ \ldots +D_M \times E_M)/M,$$

$$R_2=(D_1 \times A_1+D_1 \times A_2+D_3 \times A_3+ \ldots +D_M \times A_M)/M, \text{ and}$$

$$R_3=(E_1-A_1+E_1-A_2+E_3 \times A_3+ \ldots +E_M-A_M)/M.$$

In this embodiment it is expected that $R_4, R_2,$ and $R_3$ will be small compared to 1. For this embodiment $R_1$ and $R_2$ must be less than 0.05 and $R_3$ must be less than 0.10. The mask quality is then evaluated as described in the preceding embodiment and as shown in the flow diagram of FIG. 7.

While the invention has been particularly shown and described with reference to the preferred embodiments thereof, it will be understood by those skilled in the art that various changes in form and details may be made without departing from the spirit and scope of the invention.

What is claimed is:

1. A method of checking mask quality, comprising the steps of:

providing a circuit design;

providing technical analysis of said circuit design;

forming a $P^-$ well mask pattern;

forming a $N^-$ well mask pattern;

forming a P field mask pattern;

forming a $P^+$ source/drain mask pattern;

forming a $N^+$ source/drain mask pattern;

dividing each of said $P^-$ well mask pattern, said $N^-$ well mask pattern, said P field mask pattern, said $P^+$ source/drain mask pattern, and said $N^+$ source/drain mask pattern into M segments numbered 1 through M wherein M is a positive integer, each of said numbered segments of one of said mask patterns has the same relative location as said numbered segment of every other mask pattern having the same number, and the tone of each of said M segments of each mask is either clear or dark;

assigning index numbers $A_1$ through $A_M$ for said segments of said $P^-$ well mask numbered 1 through M respectively wherein said index numbers $A_1$ through $A_M$ are 0 for those said segments of said $P^-$ well mask having a dark tone and 1 for those segments of said $P^-$ well mask having a clear tone;

assigning index numbers $B_3$ through $B_M$ for said segments of said $N^-$ well mask numbered 1 through M respectively wherein said index numbers $B_3$ through $B_M$ are 0 for those said segments of said $N^-$ well mask having a dark tone and 1 for those said segments of said $N^-$ well mask having a clear tone;

assigning index numbers $C_1$ through $C_M$ for said segments of said P field mask numbered 1 through M respectively wherein said index numbers $C_1$ through $C_M$ are 0 for those said segments of said P field mask having a dark tone and 1 for those said segments of said P field mask having a clear tone;

assigning index numbers $D_1$ through $D_M$ for said segments of said $P^+$ source/drain mask numbered 1 through M respectively wherein said index numbers $D_1$ through $D_M$ are 0 for those said segments of said $P^+$ source/drain mask having a dark tone and 1 for those said segments of said $P^+$ source/drain mask having a clear tone;

assigning index numbers $E_1$ through $E_M$ for said segments of said $N^+$ source/drain mask numbered 1 through M respectively wherein said index numbers $E_1$ through $E_M$ are 0 for those said segments of said $N^+$ source/drain mask having a dark tone and 1 for those said segments of said $N^-$ well mask having a clear tone;

forming a first index ratio equal to a first sum divided by M wherein said first sum is $D_1 \times E_1$ plus $D_2 \times E_2$ plus $D_3 \times E_3$ plus $D_4 \times E_4$ plus . . . plus $D_M \times E_M$;

forming a second index ratio equal to a second sum divided by M wherein said second sum is $B_3 \times C_3$ plus $B_2 \times C_2$ plus $B_3 \times C_3$ plus $B_4 \times C_4$ plus . . . plus $B_M \times C_M$;

forming a third index ratio equal to a third sum divided by M wherein said third sum is $B_1 \times A_1$ plus $B_2 \times A_2$ plus $B_3 \times A_3$ plus $B_3 \times A_4$ plus . . . plus $B_M \times A_M$;

forming a fourth index ratio equal to a fourth sum divided by M wherein said fourth sum is $E_1 \times B_3$ plus $E_2 \times B_2$ plus $E_3 \times B_3$ plus $E_1 \times B_4$ plus . . . plus $E_M \times B_M$;

forming a fifth index ratio equal to a fifth sum divided by M wherein said fifth sum is $D_1 - B_3$ plus $D_2 - B_2$ plus $D_3 - B_3$ plus $D_1 - B_3$ plus . . . plus $D_M - B_M$;

releasing said $P^-$ well mask pattern, said $N^-$ well mask pattern, said P field mask pattern, said $P^+$ source/drain mask pattern, and said $N^+$ source/drain mask pattern for continued processing if said first index ratio is less than a first index number, said second index ratio is less than a second index number, said third index ratio is less than a third index number, said fourth index ratio is less than a fourth index number, and said fifth index ratio is less than a fifth index number; and holding said $P^-$ well mask pattern, said $N^-$ well mask pattern, said P field mask pattern, said $P^+$ source/drain mask pattern, and said $N^+$ source/drain mask pattern, thereby preventing continued processing, and performing additional technical analysis of said circuit design and said mask patterns if said first index ratio is greater than or equal to said first index number, said second index ratio is greater than or equal to said second index number, said third index ratio is greater than or equal to said third index number, said fourth index ratio is greater than or equal to said fourth index number, or said fifth index ratio is greater than or equal to said fifth index number.

2. The method of claim 1 wherein M is between about 30,000,000 and 50,000,000.

3. The method of claim 1 wherein said first index number is about 0.05.

4. The method of claim 1 wherein said second index number is about 0.05.

5. The method of claim 1 wherein said third index number is about 0.05.

6. The method of claim 1 wherein said fourth index number is about 0.10.

7. The method of claim 1 wherein said fifth index number is about 0.10.

8. A method of checking mask quality, comprising the steps of:

providing a circuit design;

providing technical analysis of said circuit design;

forming a $N^-$ well mask pattern;

forming a P field mask pattern;

forming a $P^+$ source/drain mask pattern;

forming a $N^+$ source/drain mask pattern;

dividing each of said $N^-$ well mask pattern, said P field mask pattern, said $P^+$ source/drain mask pattern, and said $N^+$ source/drain mask pattern into M segments numbered 1 through M wherein M is a positive integer, each of said numbered segments of one of said mask patterns has the same relative location as said numbered segment of every other mask pattern having the same number, and the tone of each of said M segments of each mask is either clear or dark;

assigning index numbers $B_1$ through $B_M$ for said segments of said $N^-$ well mask numbered 1 through M respectively wherein said index numbers $B_1$ through $B_M$ are 0 for those said segments of said $N^-$ well mask having a dark tone and 1 for those said segments of said $N^-$ well mask having a clear tone;

assigning index numbers $C_1$ through $C_M$ for said segments of said P field mask numbered 1 through M respectively wherein said index numbers $C_1$ through $C_M$ are 0 for those said segments of said P field mask having a dark tone and 1 for those said segments of said P field mask having a clear tone;

assigning index numbers $D_1$ through $D_M$ for said segments of said $P^+$ source/drain mask numbered 1 through M respectively wherein said index numbers $D_1$ through $D_M$ are 0 for those said segments of said $P^+$ source/drain mask having a dark tone and 1 for those said segments of said $P^+$ source/drain mask having a clear tone;

assigning index numbers $E_1$ through $E_M$ for said segments of said $N^+$ source/drain mask numbered 1 through M respectively wherein said index numbers $E_1$ through $E_M$ are 0 for those said segments of said $N^+$ source/drain mask having a dark tone and 1 for those said segments of said $N^-$ well mask having a clear tone;

forming a first index ratio equal to a first sum divided by M wherein said first sum is $D_1 \times E_1$ plus $D_2 \times E_2$ plus $D_3 \times E_3$ plus $D_4 \times E_4$ plus ... plus $D_M \times E_M$;

forming a second index ratio equal to a second sum divided by M wherein said second sum is $B_1 \times C_1$ plus $B_2 \times C_2$ plus $B_3 \times C_3$ plus $B_4 \times C_4$ plus ... plus $B_M \times C_M$;

forming a third index ratio equal to a third sum divided by M wherein said third sum is $E_1 \times B_1$ plus $E_2 \times B_2$ plus $E_3 \times B_3$ plus $E_4 \times B_4$ plus ... plus $E_M \times B_M$;

forming a fourth index ratio equal to a fourth sum divided by M wherein said fourth sum is $D_1 - B_1$ plus $D_2 - B_2$ plus $D_3 - B_3$ plus $D_1 - B_4$ plus ... plus $D_M - B_M$;

releasing said $N^-$ well mask pattern, said P field mask pattern, said $P^+$ source/drain mask pattern, and $N^+$ source/drain mask pattern for continued processing if said first index ratio is less than a first index number, said second index ratio is less than a second index number, said third index ratio is less than a third index number, and said fourth index ratio is less than a fourth index number; and holding said $N^-$ well mask pattern, said P field mask pattern, said $P^+$ source/drain mask pattern, and said $N^+$ source/drain mask pattern, thereby preventing continued processing, and performing additional technical analysis of said circuit design and said mask patterns if said first index ratio is greater than or equal to said first index number, said second index ratio is greater than or equal to said second index number, said third index ratio is greater than or equal to said third index number, or said fourth index ratio is greater than or equal to said fourth index number.

9. The method of claim 8 wherein M is between about 30,000,000 and 50,000,000.

10. The method of claim 8 wherein said first index number is about 0.05.

11. The method of claim 8 wherein said second index number is about 0.05.

12. The method of claim 8 wherein said third index number is about 0.10.

13. The method of claim 8 wherein said fourth index number is about 0.10.

14. A method of checking mask quality, comprising the steps of:

providing a circuit design;

providing technical analysis of said circuit design;

forming a $P^-$ well mask pattern;

forming a $P^+$ source/drain mask pattern;

forming a $N^+$ source/drain mask pattern;

dividing each of said $P^-$ well mask pattern, said $P^+$ source/drain mask pattern, and said $N^+$ source/drain mask pattern into M segments numbered 1 through M wherein M is a positive integer, each of said numbered segments of one of said mask patterns has the same relative location as said numbered segment of every other mask pattern having the same number, and the tone of each of said M segments of each mask is either clear or dark;

assigning index numbers $A_1$ through $A_M$ for said segments of said $P^-$ well mask numbered 1 through M respectively wherein said index numbers $A_1$ through $A_M$ are 0 for those said segments of said $P^-$ well mask having a dark tone and 1 for those segments of said $P^-$ well mask having a clear tone;

assigning index numbers $D_1$ through $D_M$ for said segments of said $P^+$ source/drain mask numbered 1 through M respectively wherein said index numbers $D_1$ through $D_M$ are 0 for those said segments of said $P^+$ source/drain mask having a dark tone and 1 for those said segments of said $P^+$ source/drain mask having a clear tone;

assigning index numbers $E_1$ through $E_M$ for said segments of said $N^+$ source/drain mask numbered 1 through M respectively wherein said index numbers $E_1$ through $E_M$ are 0 for those said segments of said $N^+$ source/drain mask having a dark tone and 1 for those said segments of said $N^-$ well mask having a clear tone;

forming a first index ratio equal to a first sum divided by M wherein said first sum is $D_1 \times E_1$ plus $D_2 \times E_2$ plus $D_3 \times E_3$ plus $D_4 \times E_4$ plus ... plus $D_M \times E_M$;

forming a second index ratio equal to a second sum divided by M wherein said second sum is $D_1 \times A_1$ plus $D_2 \times A_2$ plus $D_3 \times A_3$ plus $D_4 \times A_4$ plus ... plus $D_M \times A_M$;

forming a third index ratio equal to a third sum divided by M wherein said third sum is $E_1 - A_1$ plus $E_2 - A_2$ plus $E_3 - A_3$ plus $E_4 - A_4$ plus ... plus $E_M - A_M$;

releasing said $P^-$ well mask pattern, said $P^+$ source/drain mask pattern, and said $N^+$ source/drain mask pattern for continued processing if said first index ratio is less than a first index number, said second index ratio is less than a second index number, and said third index ratio is less than a third index number; and holding said $P^-$ well mask pattern, said $P^+$ source/drain mask pattern, and said $N^+$ source/drain mask pattern, thereby preventing continued processing, and performing additional technical analysis of said circuit design and said mask patterns if said first index ratio is greater than or equal to said first index number, said second index ratio is greater than or equal to said second index number, or said third index ratio is greater than or equal to said third index number.

15. The method of claim 14 wherein M is between about 30,000,000 and 50,000,000.

16. The method of claim 14 wherein said first index number is about 0.05.

17. The method of claim 14 wherein said second index number is about 0.05.

18. The method of claim 14 wherein said third index number is about 0.10.

* * * * *